US 12,421,009 B2

(12) United States Patent
Cheon et al.

(10) Patent No.: US 12,421,009 B2
(45) Date of Patent: Sep. 23, 2025

(54) TRAY MODULE

(71) Applicant: Samsung Display Co., LTD., Yongin-si (KR)

(72) Inventors: Minjong Cheon, Yongin-si (KR); Kihyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 233 days.

(21) Appl. No.: 18/322,002

(22) Filed: May 23, 2023

(65) Prior Publication Data

US 2024/0092552 A1 Mar. 21, 2024

(30) Foreign Application Priority Data

Sep. 15, 2022 (KR) ........................ 10-2022-0116445

(51) Int. Cl.
| | |
|---|---|
| *B65D 73/02* | (2006.01) |
| *B65D 1/36* | (2006.01) |
| *B65D 81/02* | (2006.01) |
| *B65D 81/127* | (2006.01) |
| *B65D 85/48* | (2006.01) |
| *H01L 21/673* | (2006.01) |

(52) U.S. Cl.
CPC ............ *B65D 81/127* (2013.01); *B65D 1/36* (2013.01); *B65D 81/022* (2013.01); *B65D 85/48* (2013.01); *H01L 21/67333* (2013.01)

(58) Field of Classification Search
CPC ...... B65D 73/02; B65D 5/5028; B65D 75/30; B65D 85/48; B65D 2313/10; B65D 73/0028; H05K 13/0084; H05K 13/0417; H01L 2924/00; H01L 2924/00014; H01L 2924/181; H01L 2224/48227; H01L 2224/32225; H01L 2224/73265
USPC ........................ 206/460, 714, 813, 63.5, 722
See application file for complete search history.

(56) References Cited

U.S. PATENT DOCUMENTS

| | | | | |
|---|---|---|---|---|
| 4,251,712 A | * | 2/1981 | Parr ...................... | H05B 3/84 |
| | | | | 428/41.9 |
| 2013/0075282 A1 | * | 3/2013 | Cinader, Jr. ........... | B65B 5/04 |
| | | | | 53/471 |

FOREIGN PATENT DOCUMENTS

| | | |
|---|---|---|
| CN | 106829135 | 6/2017 |
| CN | 106882454 | 6/2017 |
| KR | 10-1030006 | 4/2011 |
| KR | 10-2022-0044022 | 4/2022 |

* cited by examiner

Primary Examiner — King M Chu

(57) ABSTRACT

A tray module includes a first protective film, a second protective film, a cover film, and a tray. The first protective film includes a first adhesive layer. A loading target part is in contact with a bottom surface of the first adhesive layer. The second protective film includes a second adhesive layer. The loading target part is in contact with an upper surface of the second adhesive layer. The cover film is in contact with a portion of the second adhesive layer exposed by a distance (e.g., a predetermined or selectable distance) from an edge of the first protective film in a direction. Since the loading target part is fixed to the tray by the cover film instead of the protective films, contamination of the loading target part or the tray due to the first adhesive layer or the second adhesive layer may be prevented.

20 Claims, 11 Drawing Sheets

TRAY MODULE

CROSS-REFERENCE TO RELATED APPLICATION

This application claims priority under 35 U.S.C. § 119 from Korean Patent Application No. 10-2022-0116445 filed in the Korean Intellectual Property Office on Sep. 15, 2022, the entire content of which incorporated herein by reference.

BACKGROUND

1. Technical Field

This disclosure relates to a tray module capable of accommodating a loading target part.

2. Description of the Related Art

A loading target part may be loaded, transported, and stored in a tray during a manufacture of a final product. The loading target part loaded into the tray may move during a transportation process. In case that the loading target part collides with the tray, the loading target part may get damaged.

To prevent such damage, protective films may be attached to an upper portion and a lower portion of the loading target part to serve as a buffer. Each of the protective films may include an adhesive layer that may be adhered to the loading target part. The protective films may be removed in a post-process.

SUMMARY

The disclosure may provide a tray module capable of preventing contamination of a loading target part or a tray by a protective film.

However, embodiments of the disclosure are not limited to those set forth herein. The above and other embodiments will become more apparent to one of ordinary skill in the art to which the disclosure pertains by referencing the detailed description of the disclosure given below.

A tray module according to an embodiment of the disclosure may include a first protective film may include a first adhesive layer that may include a bottom surface in contact with a loading target part, a second protective film that may include a second adhesive layer that may include an upper surface in contact with the loading target part, a portion of the second adhesive layer may be exposed by a distance in a lateral direction from an edge of the first protective film, a cover film may be disposed on the first protective film and contacting the exposed portion of the second adhesive layer, and a tray to accommodate the loading target part.

In an embodiment, the cover film may include a central portion corresponding to the loading target part in a plan view, and a first edge portion protruding in a diagonal direction from the central portion.

In an embodiment, the cover film may further include a second edge portion.

In an embodiment, the first and the second edge portions may be spaced-apart from each other in the diagonal direction in the plan view.

In an embodiment, a hole may be disposed in the first edge portion.

In an embodiment, the first edge portion may include a damper.

In an embodiment, the damper may protrude outward from a periphery of the first edge portion.

In an embodiment, the cover film may extend beyond a peripheral edge of the second protective film in the lateral direction.

A tray module according to an embodiment of the disclosure may include a first protective film covering a loading target part, a cover film disposed on the first protective film, the cover film including a central portion corresponding to the loading target part and an edge portion protruding in a diagonal direction from the central portion in a plan view, and a tray including a first accommodating portion corresponding to the central portion, wherein a peripheral edge of the first accommodating portion extends beyond a corresponding peripheral edge of the central portion by a first shortest distance, and a second accommodating portion corresponding to the edge portion, wherein a peripheral edge of the second accommodating portion extends beyond a corresponding peripheral edge of the edge portion by a second shortest distance, wherein the second shortest distance is less than the first shortest distance.

In an embodiment, the second accommodating portion may be adjacent to each of at least two edges of the first accommodating portion in the plan view.

In an embodiment, the tray may include two second accommodating portions, the two second accommodating portions may be spaced-apart from each other in the diagonal direction in the plan view.

In an embodiment, the tray module may further include a second protective film disposed under the loading target part.

In an embodiment, a distance between a sidewall of the tray and the second protective film may be equal to a distance between the sidewall of the tray and the cover film.

In an embodiment, a distance between a sidewall of the tray and the second protective film may be larger than the distance between the sidewall of the tray and the cover film.

In an embodiment, a distance between a sidewall of the tray and the first protective film may be larger than the distance between a sidewall of the tray and the cover film.

In an embodiment, a damper may be disposed in the second accommodating portion.

In an embodiment, the damper may be a recess curved inwards towards the edge portion.

In an embodiment, a hole may be disposed in the edge portion.

In an embodiment, the second accommodating portion may further include a fixing portion penetrating the hole.

In an embodiment, the fixing portion may have a conical shape with a diameter decreasing with distance from the second accommodating portion.

Since the loading target part is fixed to the tray by the cover film instead of the protective film, contamination of the loading target part or the tray due to the first adhesive layer included in the first protective film or the second adhesive layer included in the second protective film may be prevented.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
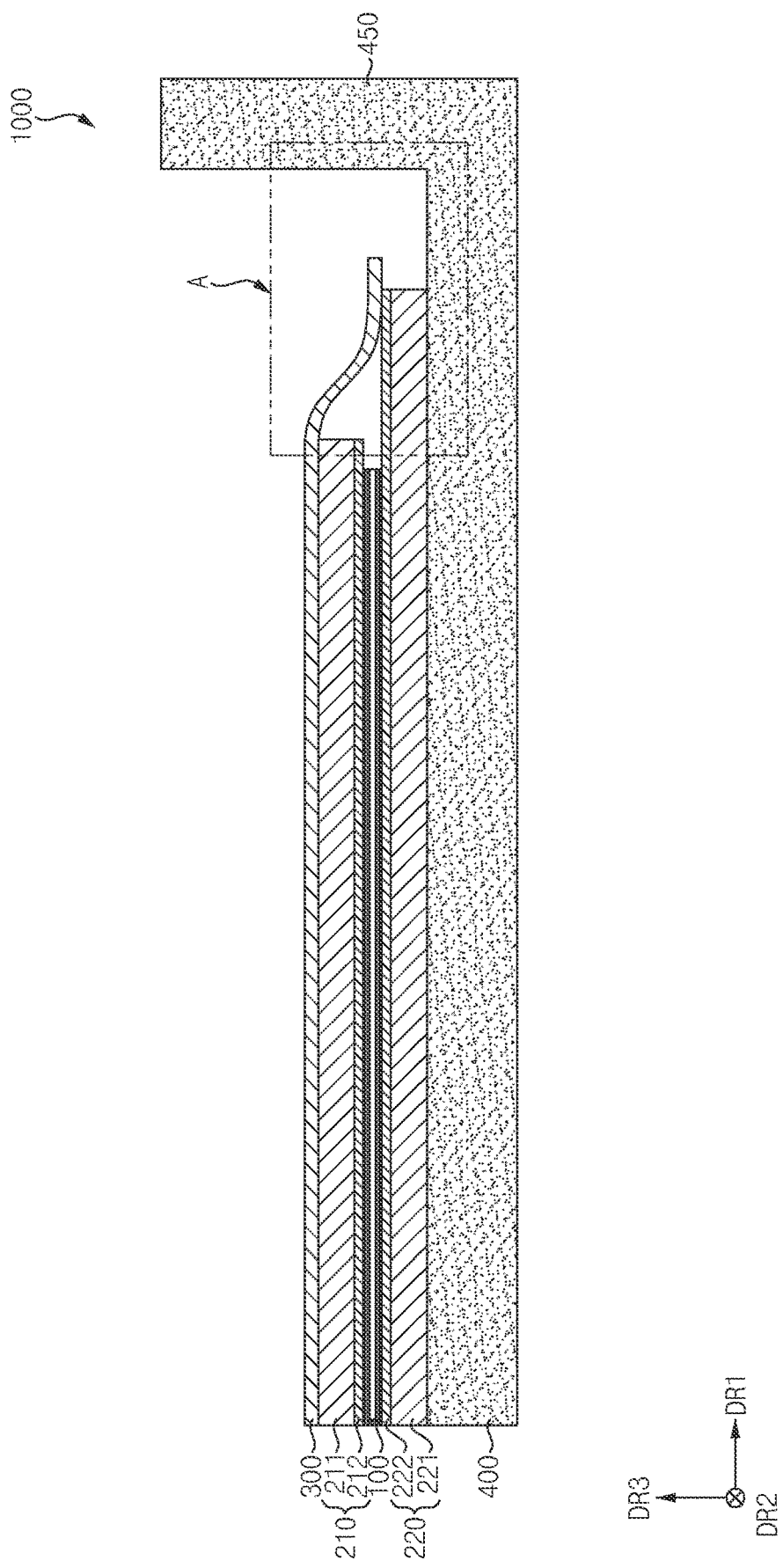
FIG. 1 is a schematic cross-sectional view of a tray module according to an embodiment of the disclosure.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing exemplary features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals and/or reference characters denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Figure 2:
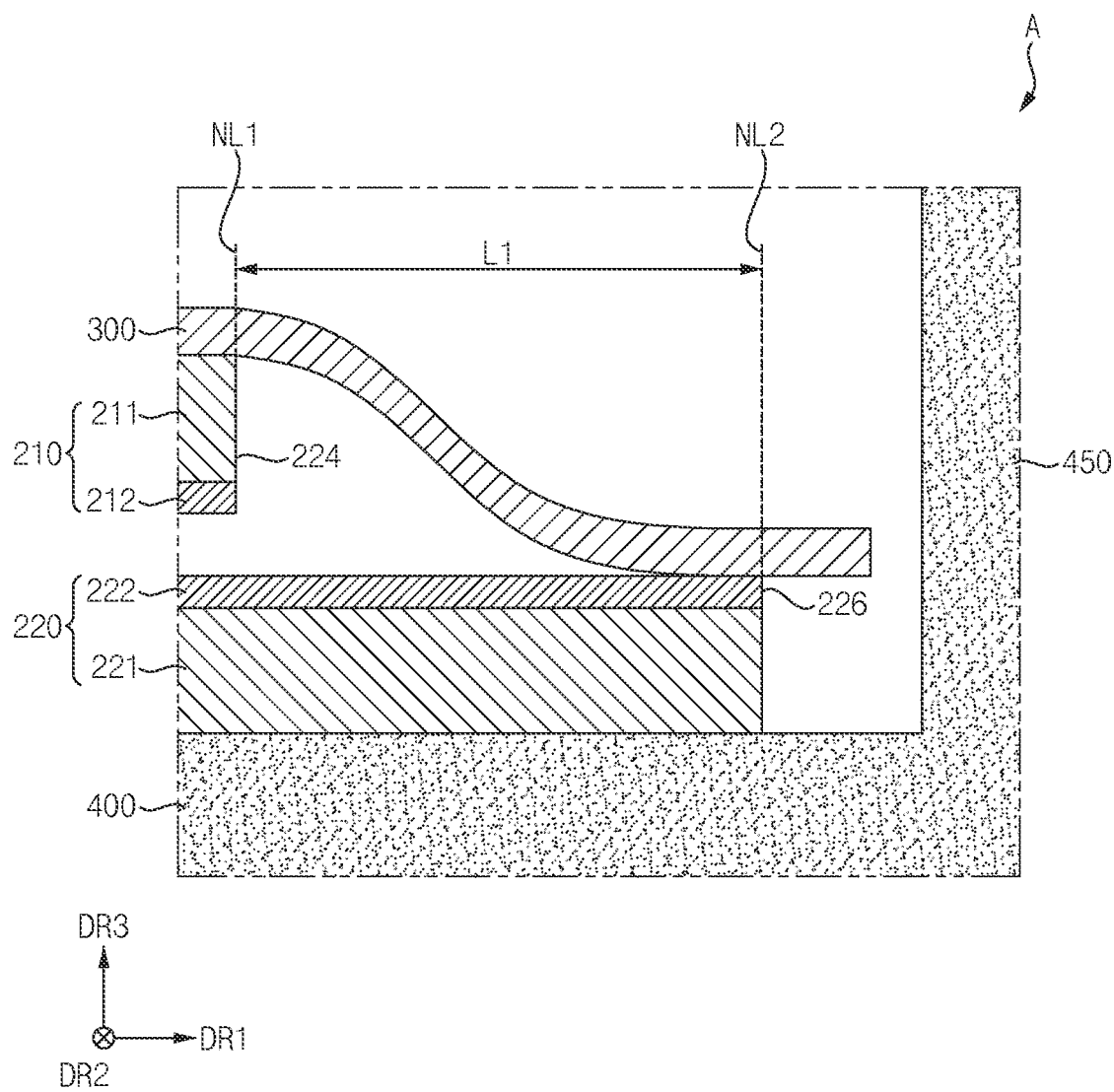
FIG. 2 is an enlarged view of area A of FIG. 1.
Figure 3:
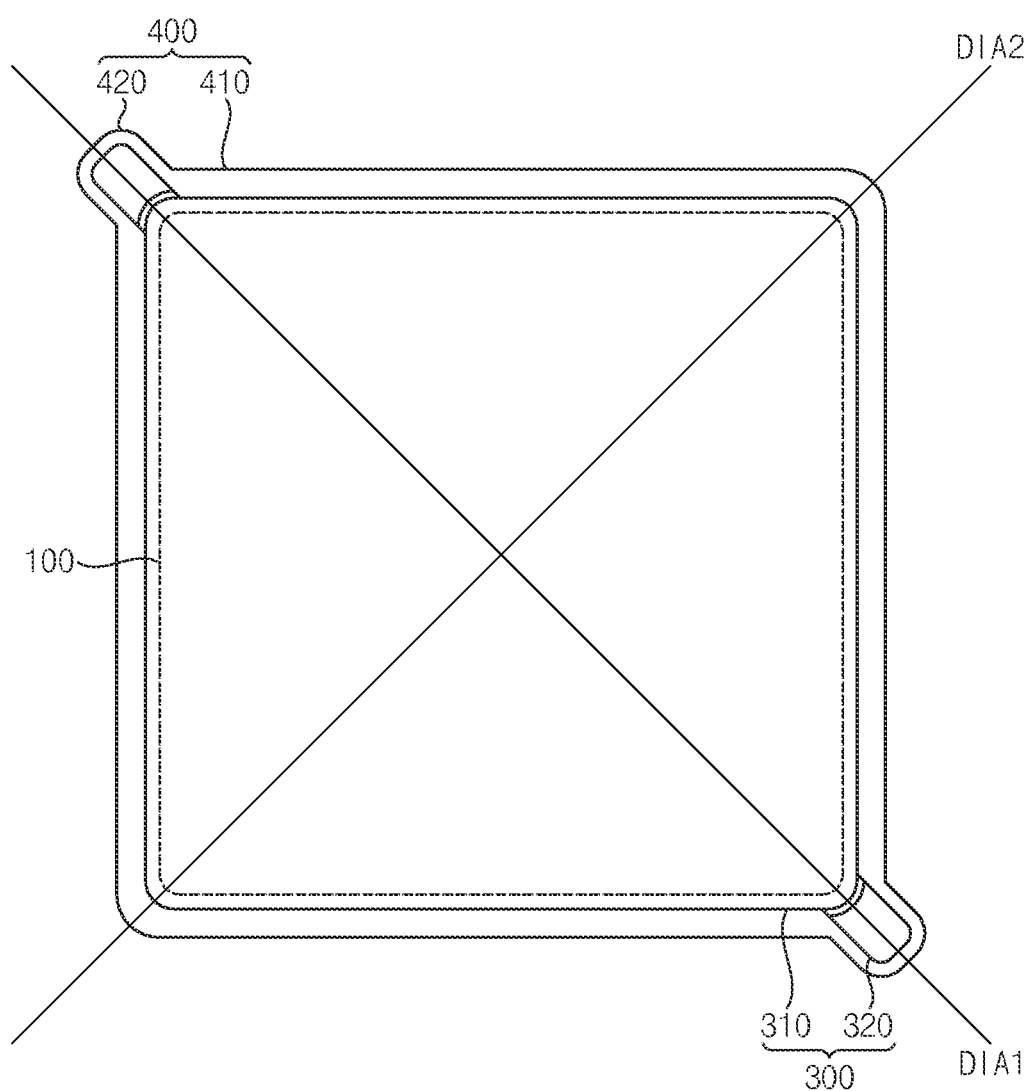
FIG. 3 is a plan view of the tray module of FIG. 1.

Turning now to FIGS. 1 to 3, FIG. 1 is a schematic cross-sectional view of a tray module 1000 according to an embodiment of the disclosure, FIG. 2 is an enlarged view of area A of FIG. 1, and FIG. 3 is a plan view of the tray module of FIG. 1. Referring to FIG. 1, the tray module 1000 according to the embodiment of the disclosure may include a first protective film 210, a second protective film 220, a cover film 300, and a tray 400. The tray module 1000 may accommodate a loading target part 100. The loading target part 100 may include glass. For example, the loading target part 100 may be ultra-thin glass. The ultra-thin glass may have a thickness of about 300 μm or less. The loading target part 100 may be a display device, however a type of the display device may not be limited. Also, the loading target part 100 may not be limited as long as the loading target part 100 may be transported by the tray 400.

Each of the first protective film 210 and the second protective film 220 may be adhered to the loading target part 100 to prevent damage to the loading target part 100. Specifically, the first protective film 210 may adhere to an upper portion of the loading target part 100, and the second protective film 200 may adhere to a bottom portion of the loading target part 100. Each of the first protective film 210 and the second protective film 220 may have a film form having a certain thickness. Each of the first protective film 210 and the second protective film 220 may adhere to the upper portion and the bottom portion respectively of the loading target part 100 using an adhesive. Each of the first protective film 210 and the second protective film 220 may be removed from the loading target part 100 in a process of manufacturing a final product.

The first protective film 210 may include a first base film layer 211 and a first adhesive layer 212. At a bottom surface of the first adhesive layer 212 (for example, under the first adhesive layer 212), the first protective film 210 may contact the loading target part 100. The first base film layer 211 may protect the loading target part 100.

The first base film layer 211 may include a material preventing an occurrence of scratches to the loading target part 100 (capable of preventing scratches from occurring on the loading target part). For example, the first base film layer 211 may include plastics such as a polyethylene terephthalate, a polyethylene naphthalate, a polycarbonate, a polymethyl methacrylate, a polystyrene, a polyvinyl chloride, a polyethersulfone, a polyethylene, a polypropylene, the like, or a combination thereof. However, the disclosure may not be limited thereto as the material of the first base film layer 211 may instead be some other material capable of serving as a buffer.

The first adhesive layer 212 may include an adhesive such as an acrylic-based adhesive, a silicon-based adhesive, a urethane-based adhesive, a rubber-based adhesive, a vinyl-ether-based adhesive, the like, or a combination thereof. For example, the first adhesive layer 212 may include an optically clear adhesive, pressure sensitive adhesive, the like, or a combination thereof. However, the disclosure may not be limited thereto, as the material of the first adhesive layer 212 may instead be some other material capable of adhering to the loading target part 100.

An area of the first adhesive layer 212 may be substantially equal to an area of the first protective film 210. Accordingly, the first adhesive layer 212 may adhere the first protective film 210 to the loading target part 100.

In an embodiment, the first protective film 210 may have a multi-layer structure. Accordingly, the strength of the first protective film 210 that protects the loading target part 100 may be increased. The first protective film 210 may instead have a single-layer structure.

Although referred to as the first protective film 210 and the second protective film 220 according to stacking locations, the first protective film 210 and the second protective film 220 may have same elements. Hereinafter, any repetitive detailed descriptions of a same or like elements as those of the first protective film 210 described above will be omitted or simplified.

The second protective film 220 may include a second base film layer 221 and a second adhesive layer 222. The upper surface of the second adhesive layer 222 may contact the loading target part 100. The second base film layer 221 may protect the loading target part 100.

The second base film layer 221 may include a same material as the first base film layer 211. The second base film layer 221 may instead include a material different from that of the first base film layer 211. For example, the second base film layer 221 may include plastics such as a polyethylene terephthalate, a polyvinyl chloride, a polycarbonate, a polyether sulfone, the like, or a combination thereof but the disclosure may not be limited thereto as an other material may instead be used as long as the material is capable of serving as a buffer.

The second adhesive layer 222 may include an adhesive such as an acrylic-based adhesive, a silicon-based adhesive, a urethane-based adhesive, a rubber-based adhesive, a vinyl-ether-based adhesive, the like, or a combination thereof. For example, the second adhesive layer 222 may include an adhesive such as an optically clear adhesive, pressure sensitive adhesive, the like, or a combination thereof. The disclosure may not be limited thereto as other materials may instead be included in the second adhesive layer 222 as long as the material is capable of being adhered to the loading target part 100.

An area of the second adhesive layer 222 may be substantially equal to an area of the second protective film 220. Accordingly, the second adhesive layer 222 may adhere the second protective film 220 to the loading target part 100.

The second protective film 220 may instead not include the second adhesive layer 222. For example, the first protective film 210 and the second protective film 220 may both be adhered to the loading target part 100 by the first adhesive layer 212.

The cover film 300 may include plastics such as a polyimide, a polyethylene terephthalate, a polyethylene naphthalate, a polyether sulfone, an nylon, a polytetrafluoro ethylene, a polyetheretherketone, a polycarbonate, a polyarylate, the like, or a combination thereof but the disclosure may not be limited thereto. A detailed description of the cover film 300 will be described later with reference to FIG. 2.

The tray 400 according to the embodiment of the disclosure may accommodate multiple loading target parts. The tray 400 may be a transport mechanism for transporting multiple loading target parts. The tray 400 may include multiple pocket parts, and each of the multiple pocket parts may accommodate one or more of the loading target parts. For example, the tray 400 may include six pocket parts however, the number of the pocket parts may be changed in consideration of a size, weight, and the like of the loading target part 100.

Multiple trays may be stacked on each other. Accordingly, the tray 400 may transport the multiple loading target parts. Specifically, the tray 400 may be stacked on each other in a third direction DR3. Accordingly, the transport device may transport multiple trays. Here, the third direction DR3 may cross a first direction DR1 and a second direction DR2, respectively.

During transport, the loading target part 100 may be damaged by impact. Accordingly, the tray 400 may include a material capable of absorbing the impact. For example, the tray 400 may include a styrofoam such as an expanded polystyrene, an expanded polypropylene, the like, or a combination thereof but the disclosure may not be limited thereto, and the tray 400 may instead include other various materials, and the tray 400 may be manufactured in various ways depending on the materials. A detailed description of the tray 400 will be described later with reference to FIGS. 3 and 6 to 12.

Each of the first protective film 210 and the second protective film 220 may be laminated with the loading target part 100 disposed therebetween. After the lamination, in case that a center of the first protective film 210 and a center of the second protective film 220 do not coincide, a lamination tolerance may occur in the first direction DR1 and/or the second direction DR2 in a schematic cross-sectional view. For example, as shown in FIG. 1, the second protective film 220 may be disposed closer to a sidewall 450 (hereinafter, the a sidewall 450 may be referred to as a right sidewall 450) of the tray 400. On the other hand, the first protective film 210 may instead be disposed closer to another sidewall (e.g., a left sidewall).

In case that the tray 400 is transported, the loading target part 100 may move within the tray 400. Accordingly, an adhesive may contact and be rubbed onto the tray 400 (e.g., the adhesive included in the first adhesive layer 212 and/or the second adhesive layer 222 may contaminate the tray 400). Hereinafter, the principle of operation of the tray module 1000 capable of preventing the contamination of the tray 400 will be described with reference to FIGS. 2 to 12.

Referring to FIG. 2, the cover film 300 may prevent the contamination of the tray 400. The first protective film 210 may be disposed on the upper portion of the loading target part 100, and the second protective film 220 may be disposed on the bottom portion of the loading target part 100. The cover film 300 may be disposed on an upper portion of the first protective film 210. The cover film 300 may be cut after the lamination to correspond to a shape of the tray 400. At this time, the cover film 300 may be cut to be larger than the first protective film 210 and the second protective film 220. Accordingly, the first adhesive layer 212 and the second adhesive layer 222 may be prevented from contacting the tray 400.

The first protective film 210 and the second protective film 220 may not completely overlap each other in the first direction DR1 and/or the second direction DR2. As a result, the second adhesive layer 222 may be exposed by a distance L1 (e.g., a predetermined or selectable distance L1) from an edge 226 of the second protective film 220. Instead, the first adhesive layer 212 may be exposed by the distance L1 (e.g., a predetermined or selectable distance L1) from an edge 224 of the first protective film 210. The distance L1 (e.g., a predetermined or selectable distance L1) may be defined as a horizontal distance between a first vertical line NL1 passing through the edge 224 of the first protective film 210 and a second vertical line NL2 passing through the edge 226 of the second protective film 220. Each of the vertical lines (e.g., the first vertical line NL1, and the second vertical line NL2) may be parallel to the third direction DR3. The horizontal distance may be measured in the first direction DR1. In the schematic cross-sectional view, the edge 226 of the second protective film 220 may be closer to the sidewall 450 of tray 400 than the edge 224 of the first adhesive layer 212.

The cover film 300 may contact a portion of the second adhesive layer 222 exposed by the distance L1 (e.g., a predetermined or selectable distance L1) from the edge 224 of the first protective film 210 in a direction (e.g., the first direction DR1 or a lateral direction). In an embodiment, the cover film 300 may extend from the edge 224 of the first protective film 210 to the edge 226 of the second protective film 220 and towards the sidewall 450 of the tray 400. In an embodiment, the cover film 300 may instead extend in a direction (e.g., the first direction DR1 or a lateral direction) from the edge 226 of the second protective film 220.

The cover film 300 may contact the portion of the second adhesive layer 222 exposed by the distance L1 (e.g., a predetermined or selectable distance L1) from the edge 224 of the first protective film 210 in the a direction (for example, the edge 226 of the second protective film 220). Accordingly, in case that the loading target part 100 moves within the tray 400, the right sidewall 450 of the tray 400 may rub up only against the cover film 300. In other words, the tray 400 may be prevented from being contaminated by foreign material generated by the adhesive included in the first adhesive layer 212 and/or the second adhesive layer 222 contacting and rubbing up against the tray 400. The cover film 300 may prevent an exposed portion of the second adhesive layer 222 i.e., near the edge 226 of the second protective film 220 from contacting the tray 400.

In case that the tray module 1000 according to the embodiments of the disclosure described above with reference to FIGS. 1 and 2 does not include the cover film 300, foreign material may be generated due to the second adhesive layer 222 included in the second protective film 220 rubbing up against the tray 400, but the disclosure may not be limited thereto. To prevent the contamination of the tray 400 due to the adhesive, a size of the cover film 300 may not be limited as long as the size or more may cover the laminated the first protective film 210 and the second protective film 220.

Referring to FIG. 3, the cover film 300 may include a central portion 310 and an edge portion 320. In the plan view, the central portion 310 may have a rectangular shape with rounded corners however, the disclosure may not be limited thereto as the central portion 310 may instead have a various other shapes such as circular, polygon, and the like.

The central portion 310 may have a sufficient size to cover the loading target part 100. In the plan view, the central portion 310 may overlap the loading target part 100. Specifically, an area of the central portion 310 may be larger than an area of the loading target part 100. For example, peripheral edges of the central portion 310 may be spaced apart by about 1 mm or more from peripheral edges of the loading target part 100 both vertically and horizontally. In case that a separation distance (for example, a shortest distance between any one of the peripheral edges of the central portion 310 and corresponding peripheral edge of the loading target part 100 (the one peripheral edge of the loading target part 100 disposed closest to the any one of the peripheral edges of the central portion 310)) may be smaller than about 1 mm, the loading target part 100 may be damaged by impact during transport. Accordingly, a distance (i.e., an overhang distance) that each side (or peripheral edge) of the central portion 310 extends beyond a corresponding side (or peripheral edge) of the loading target part 100 by about 2 mm or more. However, the disclosure may not be limited thereto, and the separation distance may be changed in consideration of the size of the loading target part 100, the thickness of the protective films (e.g., the first protective film 210 and the second protective film 220), the like, or a combination thereof.

The edge portion (or corner portion) 320 of the cover film 300 may protrude in a first diagonal direction DIA1 or a second diagonal direction DIA2 from the central portion 310. Here, the first diagonal direction DIA1 may extend between the first direction DR1 and the opposite direction of the second direction DR2, and the second diagonal direction DIA2 may extend between the first direction DR1 and the second direction DR2.

In case that the edge portion 320 protrudes in the horizontal direction, an initial peel area of the cover film 300 may be larger than in case that the edge portion 320 protrudes in the diagonal direction (e.g., the first diagonal direction DIA1 or the second diagonal direction DIA2). Accordingly, in case that the edge portion 320 protrudes in the horizontal direction, the cover film 300 may be difficult to peel off from the loading target part 100 due to larger elasticity than in case that the edge portion 320 protrudes in the diagonal direction. Thus, the edge portion 320 may protrude in the first diagonal direction DIA1 or the second diagonal direction DIA2 from the central portion 310.

The number of the edge portions 320 may be plural. For example, the number of the edge portions 320 may be at least two. In an embodiment, the number of the edge portion 320 may be two. In case that the number of the edge portion 320 may be two, the edge portions 320 may be spaced-apart from each other in the first diagonal direction DIA1 in the plan view. In case that the edge portions 320 protrudes in a straight direction (e.g., the first direction DR1 or the second direction DR2) in the plan view, the loading target part 100 may move within the tray 400. As a result, contamination due to the adhesive may occur in the tray 400. Therefore, to prevent movement of the loading target part 100 within the tray 400, the edge portions 320 may be spaced-apart from each other in the first diagonal direction DIA1 in the plan view. The edge portions 320 may instead be spaced-apart from each other in the second diagonal direction DIA2 in the plan view.

In an embodiment, the number of edge portions 320 may be three. In an embodiment, the number of edge portions 320 may be four. As the number of edge portions 320 may be larger, movement of the loading target part 100 within the tray 400 may be effectively prevented.

In a plan view, the tray 400 may include a first accommodating portion 410 and a second accommodating portion 420. In the plan view, the first accommodating portion 410 may have a rectangular shape with rounded corners however, the disclosure may not be limited thereto as the first accommodating portion 410 may instead have a various other shapes such as circular, polygon, and the like.

In the plan view, the first accommodating portion 410 may overlap the central portion 310. Specifically, an area of the first accommodating portion 410 may be larger than the area of the central portion 310. For example, a peripheral edge of the first accommodating portion 410 may be spaced apart (i.e., overhang) about 0.1 mm or more, and about 0.4 mm or less from a corresponding or closest peripheral edge of the central portion 310 (for example, a peripheral edge of the central portion 310 disposed closest a peripheral edge of the first accommodating portion 410). In case that a separation (or overhang) distance (that is, a shortest distance between a peripheral edge of the first accommodating portion 410 and a corresponding peripheral edge of the central portion 310) may be smaller than about 0.1 mm, the sidewall of the tray 400 (e.g., the right sidewall 450 in FIG. 3) may rub up against the adhesive due to movement of the loading target part 100 within the tray 400, resulting in contamination of the tray 400. At the other extreme, in case that the separation (or overhang) distance exceeds about 0.4 mm, a manufacturing cost of the tray 400 may be increased. However, the disclosure may not be limited thereto. The separation distance may be changed in consideration of the size of the loading target part 100 and a movement rate of the loading target part 100 within the tray 400.

The second accommodating portion 420 may protrude in the first diagonal direction DIA1 from first accommodating portion 410. The second accommodating portion 420 may instead protrude in the second diagonal direction DIA2 from first accommodating portion 410.

A number of the second accommodating portions 420 included in the tray 400 may be greater than one. For example, the number of the second accommodating portions 420 may be at least two. In an embodiment, in case that the number of the edge portions 320 included in cover film 300 may be two, the number of second accommodating portions 420 included in the tray 400 maybe also be two. In such a scenario, the second accommodating portions 420 may protrude from the first accommodating portion 410 in a direction in which the edge portions 320 protrude from the central portion 310. In other words, the second accommodating portions 420 may be spaced-apart from each other in the first diagonal direction DIA1 in the plan view. The second accommodating portions 420 may instead be spaced-apart from each other in the second diagonal direction DIA2 in the plan view. Accordingly, even if the tray 400 may include only two second accommodating portions 420, movement of the loading target part 100 may be prevented. In case that the number of second accommodating portions 420 may be two as described above, the tray 400 may be more readily produced than in case that a number of second accommodating portions 420 may be more than three.

In an embodiment, the number of the second accommodating portions 420 may be three. For example, in case that the loading target part 100 may be a display device, a driving part such as a flexible printed circuit board may be disposed on a side of the display device. In this scenario, second accommodating portions 420 may be formed in three out of four sides of the first accommodating portion 410, so that the fourth side absent a second accommodating portion 420 corresponds to where the driving part may be disposed.

In an embodiment, the number of the second accommodating portions 420 may be four. As the number of the second accommodating portions 420 may be larger, movement of the loading target part 100 within the tray 400 may effectively be prevented.

Figure 4:
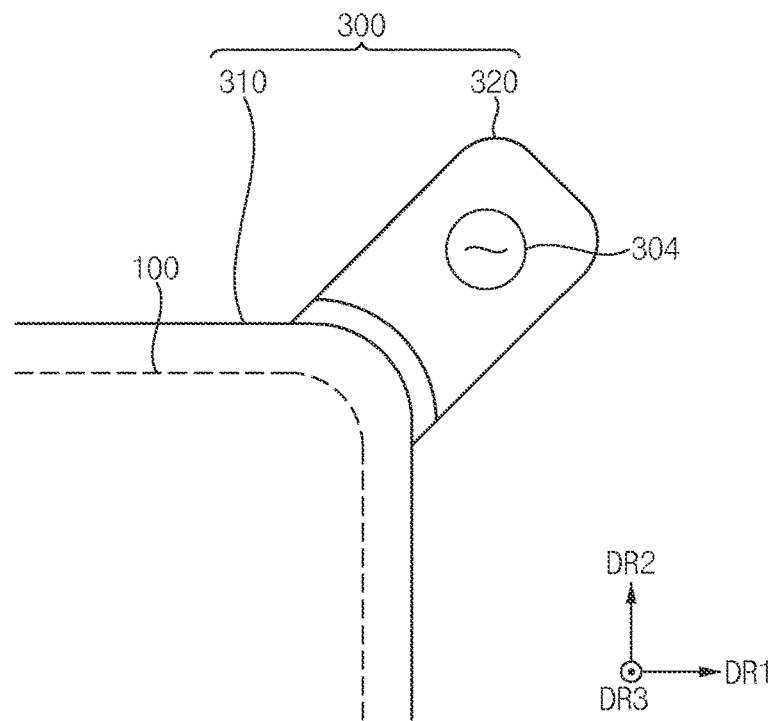
FIG. 4 is an embodiment of the edge portion of FIG. 3.

Turning now to FIG. 4, FIG. 4 is an embodiment of the edge portion 320 of FIG. 3. In the embodiment of FIG. 4, a hole 304 may be disposed in the edge portion 320. The cover film 300 may be attached to the tray 400 by inserting a fixing portion (e.g., the fixing portion 490 in FIG. 11) of the tray 400 into the hole 304 of the edge portion 320 of the cover film 300. And because the cover part 300 covers the loading target part 100, movement of the loading target part 100 within the tray 400 may be prevented. A detailed description of the fixing portion 490 will be described later with reference to FIGS. 11 and 12.

Figure 5:
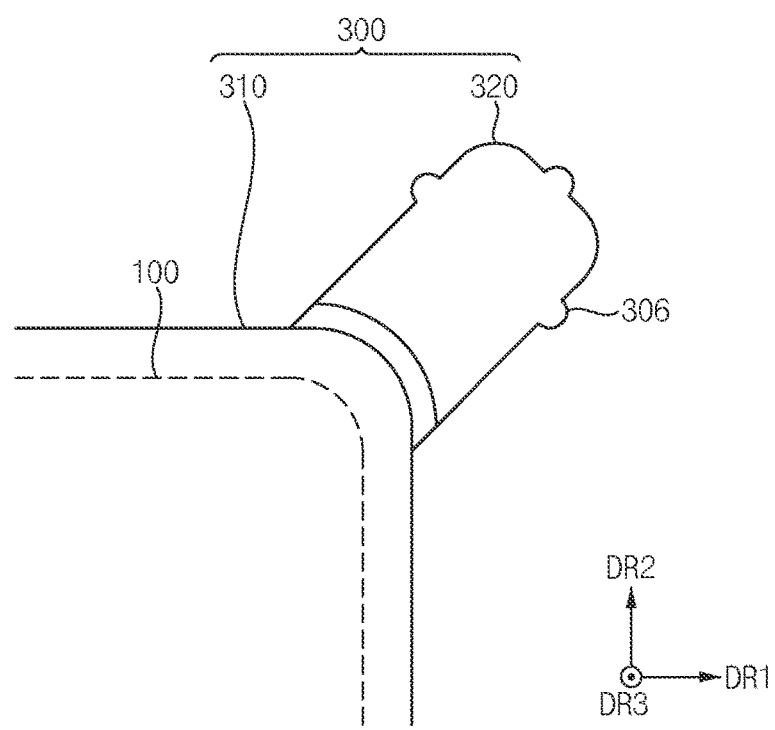
FIG. 5 is an embodiment of the edge portion of FIG. 3.

Turning now to FIG. 5, FIG. 5 is an embodiment of the edge portion 320 of FIG. 3. In the embodiment of FIG. 5, a damper 306 may be disposed in the edge portion 320 that protrudes outward from the edge portion. The damper 306 may be formed by laser cutting along an edge of the edge portion 320 however, the disclosure may not be limited thereto as the damper 306 may instead be formed through another technique.

The damper 306 may be formed on each side of the edge portion 320. The edge portion 320 may include a first side, a second side and a third side. The first side may extend from the central portion 310 in the first diagonal direction (e.g., the first diagonal direction DIA1 in FIG. 3). The second side may extend from the first side and in the second diagonal direction (e.g., the second diagonal direction DIA2 in FIG. 3). The third side may extend from the second side back towards the central portion 310 in the first diagonal direction DIAL The damper 306 may be formed in each of the first side, the second side and the third side. By forming the damper 306 in each of the first side, the second side and the third side, movement of the loading target part 100 within the tray 400 may be prevented.

Figure 6:
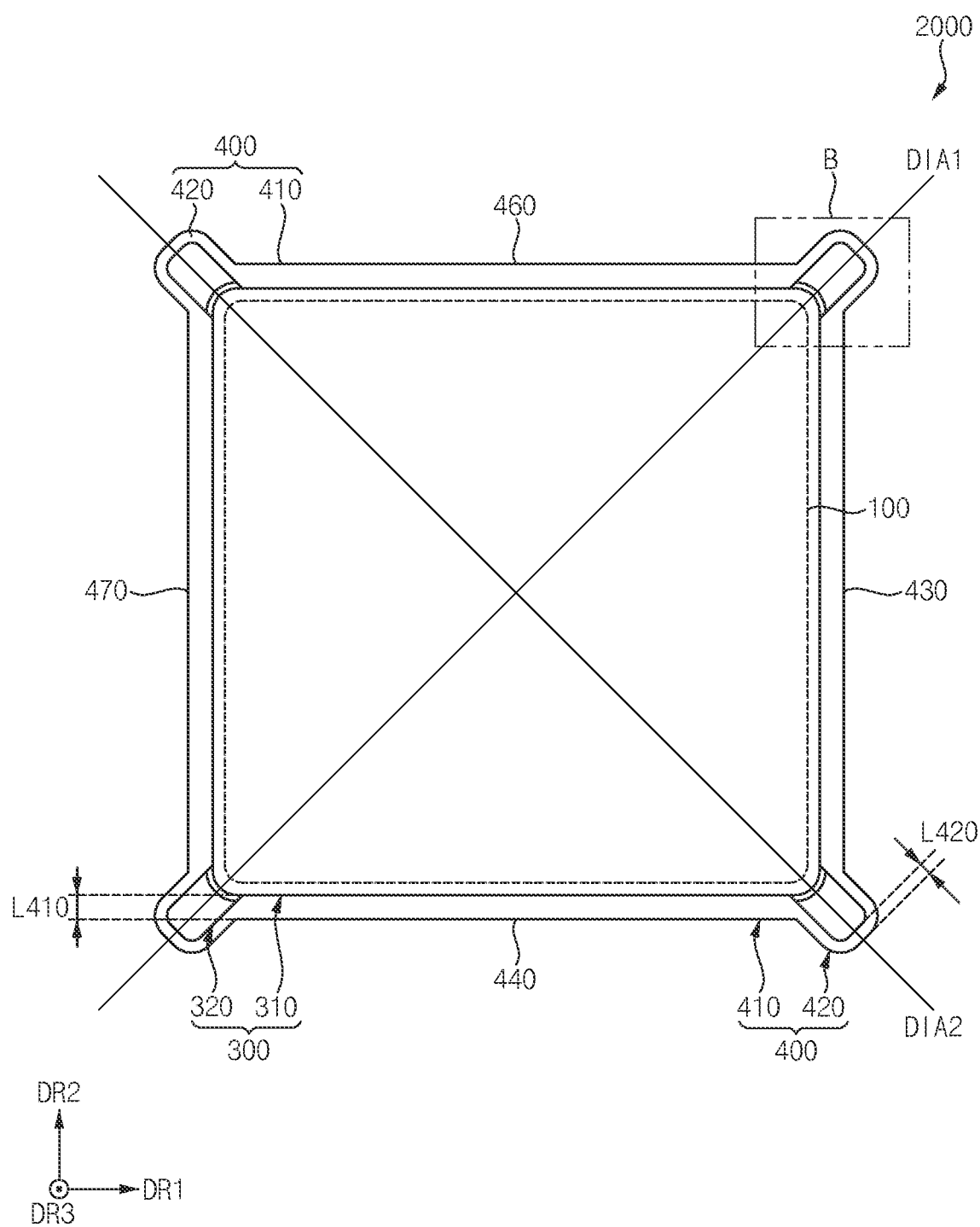
FIG. 6 is a plan view of tray module according to an embodiment of the disclosure.
Figure 7:
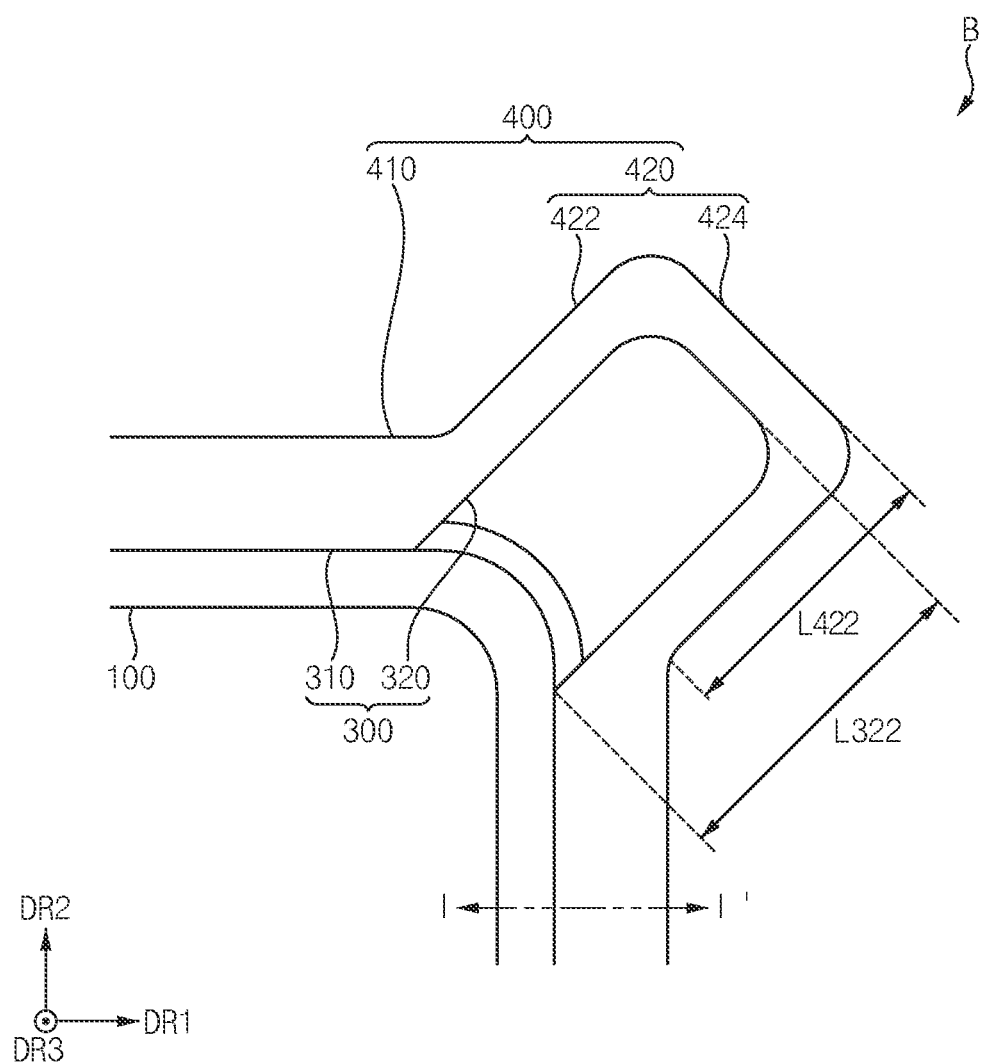
FIG. 7 is an embodiment of the second accommodating portion.
Figure 8:
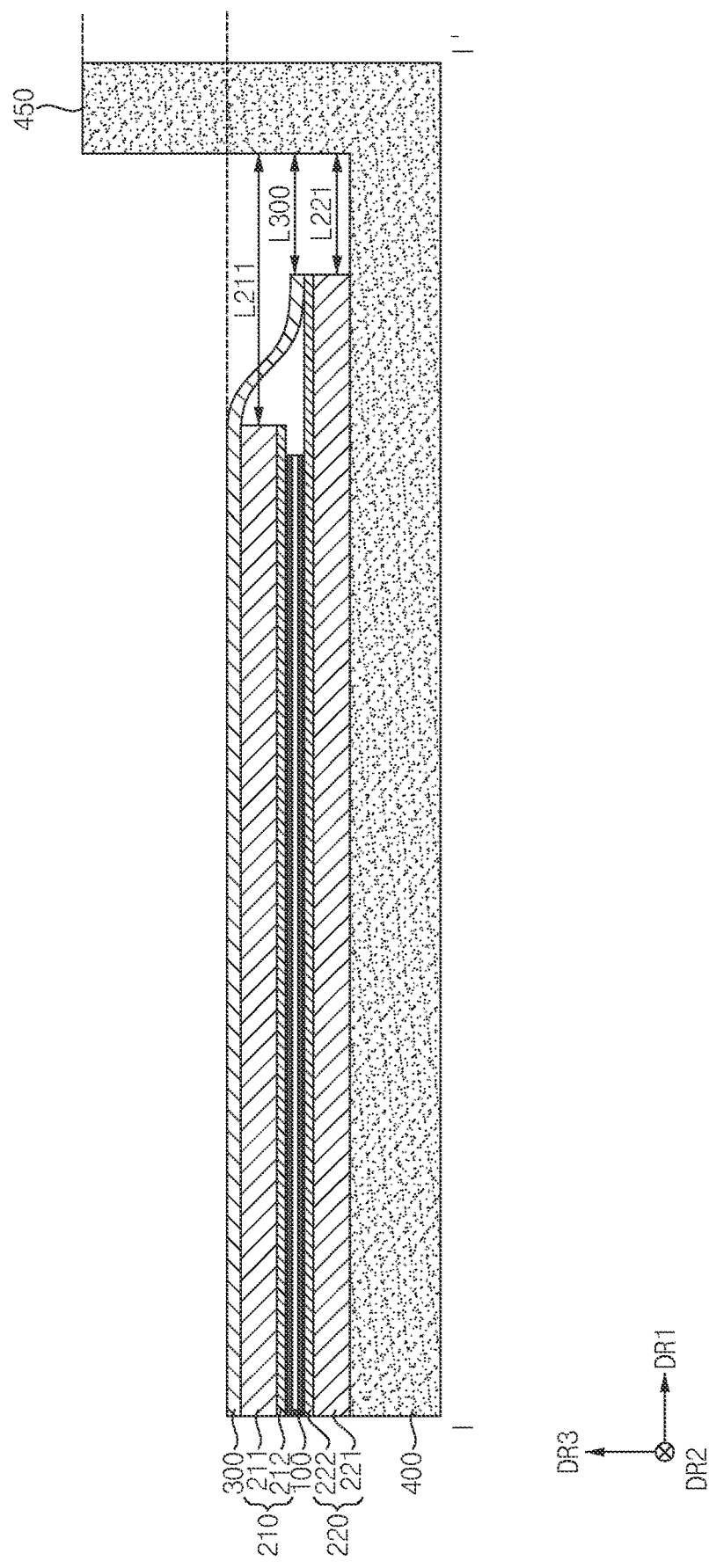
FIG. 8 is an embodiment of a schematic cross-sectional view according to a I-I' line of FIG. 7.
Figure 9:
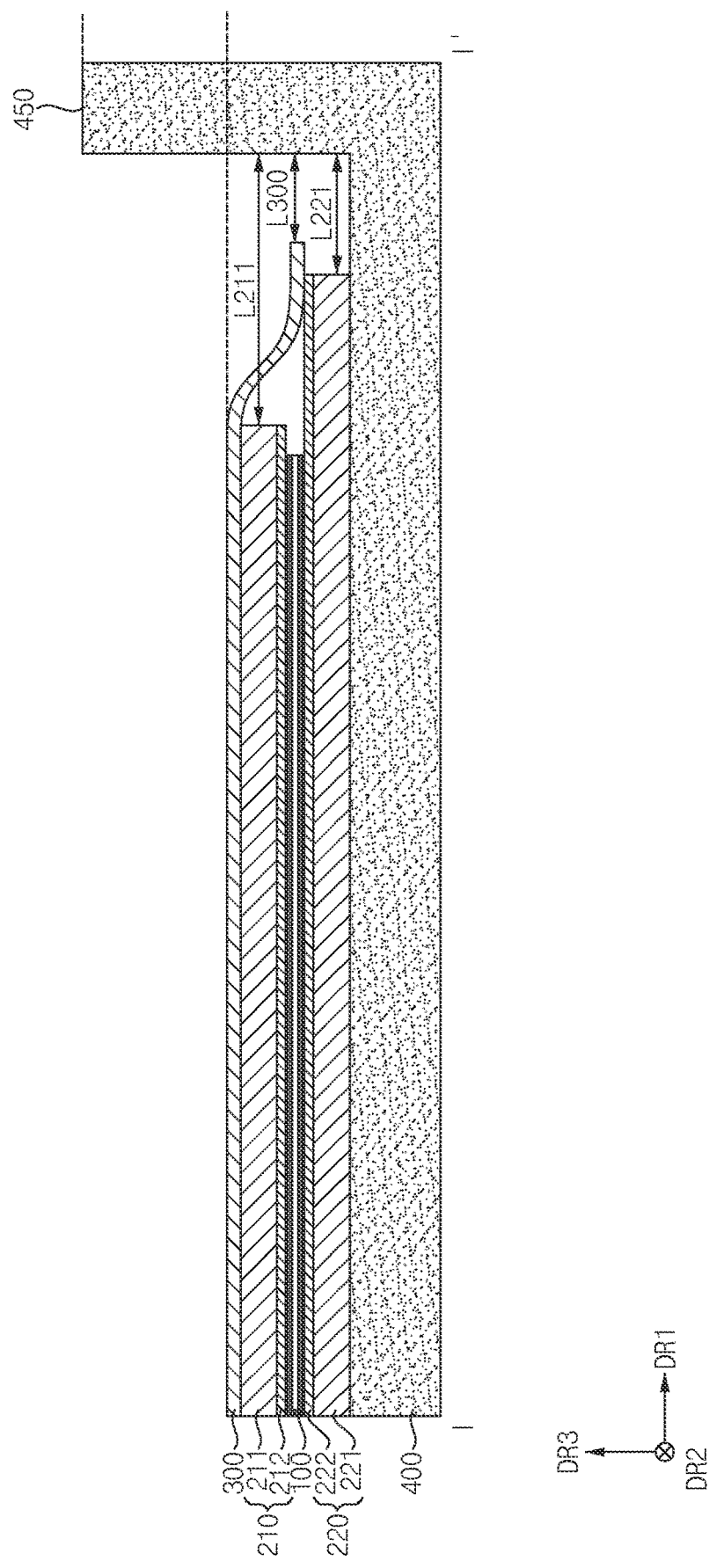
FIG. 9 is an embodiment of the schematic cross-sectional view according to the I-I' line of FIG. 7.

Turning now to FIGS. 6 to 9, FIG. 6 is a plan view of tray module 2000 according to an embodiment of the disclosure, FIG. 7 is an embodiment of the second accommodating portion 420 of the tray module 2000 of FIG. 6, FIG. 8 is an embodiment of a schematic cross-sectional view according to a I-I' line of FIG. 7, and FIG. 9 is an embodiment of the schematic cross-sectional view according to the I-I' line of FIG. 7.

Referring to FIGS. 6 to 9, the tray module 2000 according to an embodiment of the disclosure may include the first protective film 210, the second protective film 220, the cover film 300, and the tray 400. Hereinafter, any repetitive detailed descriptions of same or like elements as those of the tray module 1000 described above with reference to FIGS. 1 to 5 will be omitted or simplified.

As described above with reference to FIG. 1, the loading target part 100 may not be limited as long as the part may be capable of being transported in the tray 400. For example, the loading target part 100 may include a component such as thin glass, a final product such as a display device, and the like. After adhering the protective films (e.g., the first protective film 210 and the second protective film 220) to the upper portion and the bottom portion respectively of the loading target part 100, the fragile loading target part 100 may be transported in the tray 400.

The cover film 300 may include the central portion 310 and the edge portion 320 in the plan view. In the plan view, the central portion 310 may correspond to the loading target part 100. Specifically, the size of the central portion 310 may be larger than the size of the loading target part 100.

In the plan view, the edge portion 320 may protrude in the first diagonal direction DIA1 from the central portion 310. In case that the number of the edge portions 320 may be two, the edge portions 320 may be spaced-apart from each other in the first diagonal direction DIA1. The edge portions 320 may instead be spaced-apart from each other in the second diagonal direction DIA2.

The tray 400 may include the first accommodating portion 410 and the second accommodating portion 420 in the plan view. The first accommodating portion 410 may be capable of accommodating the central portion 310, while the second accommodating portion 420 may be capable of accommodating the edge portion 320.

The second accommodating portion 420 may be adjacent to each of at least two peripheral edges of the first accommodating portion 410 (e.g., peripheral edges 430, 440, 460 and 470 of the first accommodating portion 410) in the plan view. The second accommodating portions 420 may protrude in the first diagonal direction DIA1 from the first accommodating portion 410. The second accommodating portions 420 may instead protrude in the second diagonal direction DIA2 from first accommodating portion 410.

The number of the second accommodating portions 420 may be at least two. In case that the number of the second accommodating portions 420 is two, the second accommodating portions 420 may be spaced-apart from each other in the first diagonal direction DIA1 or in the second diagonal direction DIA2 in the plan view.

By arranging the second accommodating portions 420 to be spaced-apart from each other in a diagonal direction, movement of the loading target part 100 within the tray 400 may be prevented. A first shortest distance L410 may be defined as a distance between an edge or periphery of the first accommodating portion 410 and a corresponding edge or periphery of the central portion 310. A second shortest distance L420 may be defined as a distance between an edge or periphery of the second accommodating portion 420 and an edge or periphery of the edge portion 320. The first shortest distance L410 may be larger than the second shortest distance L420. In this scenario, even if the loading target part 100 moves within the tray 400, the edge portion 320 may contact the sidewall of the tray (e.g., the right sidewall 450 of the tray 400 in FIG. 7), and the central portion 310 may remain spaced apart from the sidewall of the tray 400. Accordingly, even if the loading target part 100 moves within the tray 400, the first adhesive layer 212 and the second adhesive layer 222 may not contact and rub against the tray 400 as the first and the second protective films 210 and 220 are absent from corner portions of the tray module 2000 corresponding to the edge portion 320 and the second accommodating portion 420.

As shown in FIG. 7, the edge portion 320 may have a protruding distance L322 (e.g., a predetermined or selectable distance L322) while the second accommodating portion 420 may have a protruding distance L422 (e.g., a predetermined or selectable distance L422). In this disclosure, the protruding distance L322 of the edge portion 320 may be larger than the protruding distance L422 of the second accommodating portion 420. Accordingly, the edge portion 320 may be fixed to the tray 400, and the central portion 310 may be spaced apart from the tray 400. As the central portion 310 may be spaced apart from the tray 400, even if the loading target part 100 moves within the tray 400, the first adhesive layer 212 and the second adhesive layer 222 may not contact the tray 400.

As shown in FIG. 8, the first protective film 210 may include the first base film layer 211 and the first adhesive layer 212. The bottom surface of the first adhesive layer 212 of the first protective film 210 may contact the loading target part 100. In other words, the first protective film 210 may be disposed on the loading target part 100.

The second protective film 220 may include the second base film layer 221 and the second adhesive layer 222. The top surface of the second adhesive layer 222 of the second protective film 220 may contact the loading target part 100. In other words, the second protective film 220 may be disposed under the loading target part 100.

In the plan view of FIG. 6, the cover film 300 may have a first distance in the first direction DR1, and a second distance in the second direction DR2. The first distance of the cover film 300 and the second distance of the cover film 300 may be equal, or may be different from each other. In other words, the cover film 300 may have a rectangular shape or a square shape in the plan view.

In the cross-sectional view of FIG. 8, the first protective film 210 and the second protective film 220 laminated on opposite sides of the loading target part 100 may not completely overlap each other. Instead, the first protective film 210 and the right sidewall 450 of the tray 400 may be spaced apart by a first distance L211, and the second protective film 220 and the right sidewall 450 of the tray 400 may be spaced apart by a second distance L221 smaller than the first distance L211.

In an embodiment, the first distance L211 may be equal to a distance obtained by adding a second distance L221 of the second protective film 220 in the first direction DR1 and a distance of the exposed portion of the second adhesive layer 222 (e.g., the predetermined or selectable distance L1 in FIG. 2). In other words, the second distance L221 between the right sidewall 450 of the tray 400 and the second protective film 220 may be equal to the distance L300 between the right sidewall 450 of the tray 400 and the cover film 300. Also, the first distance L211 between the right sidewall 450 of the tray 400 and the first protective film 210 may be larger than the distance L300 between the right sidewall 450 of the tray 400 and the cover film 300.

In the embodiment of FIG. 9, the first distance L211 may be larger than the distance obtained by adding the distance L300 between a peripheral edge of the cover film 300 and a corresponding sidewall 450 in the first direction DR1 and the distance corresponding to L1 of FIG. 2 corresponding to a length of the exposed portion of the second adhesive layer 222. In other words, each of the first distance L211 between the right sidewall 450 of the tray 400 and an edge of the first protective film 210 and the second distance L221 between the right sidewall 450 of the tray 400 and a corresponding edge of the second protective film 220 may be larger than the distance L300 between the right sidewall 450 of the tray 400 and a nearest peripheral edge of the cover film 300. Accordingly, the tray 400 and each of the protective films (e.g., the first protective film 210 and the second protective film 220) in the arrangement of FIG. 9 may be spaced apart from each other.

Figure 10:
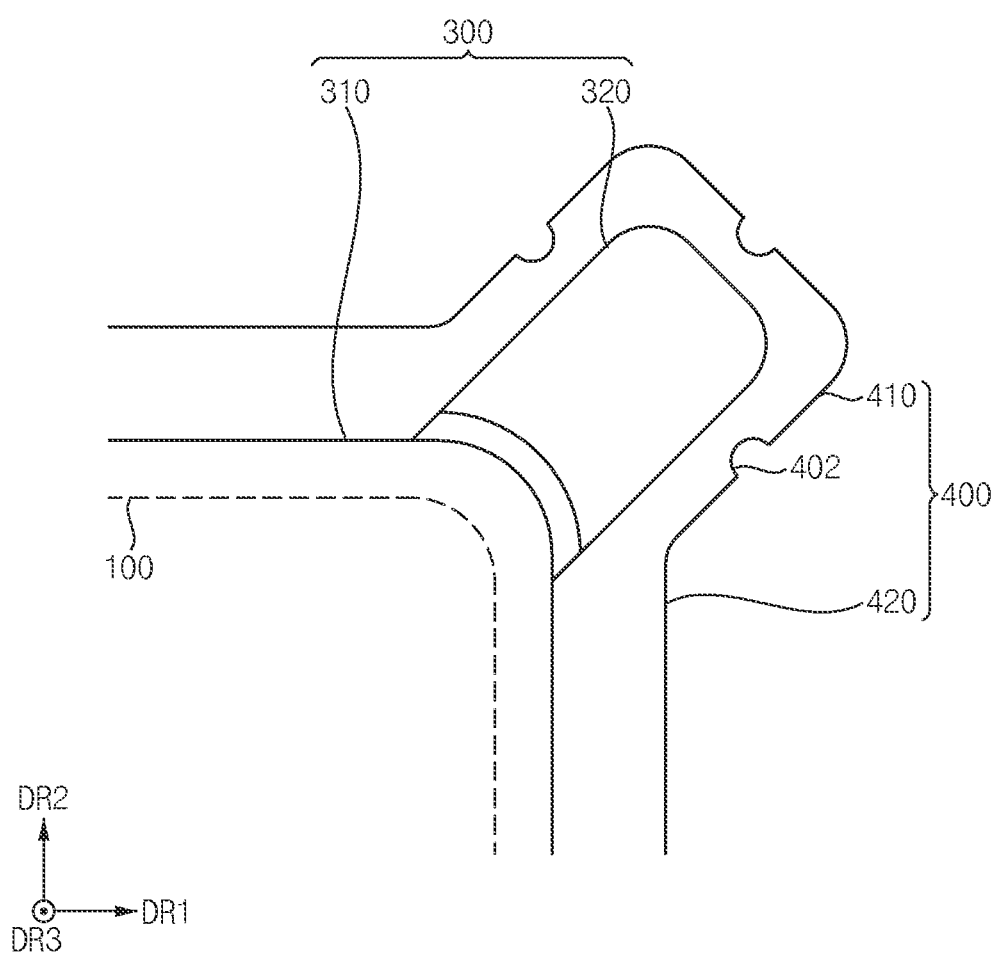
FIG. 10 is an embodiment of the second accommodating portion of FIG. 6.

Turning now to FIG. 10, FIG. 10 is a variation of the embodiment of FIG. 6 focusing in on the second accommodating portion 420. In the embodiment of FIG. 10, a damper 402 may be formed in the second accommodating portion 420. The damper 402 may be a curved recess in a peripheral edge of the second accommodating portion 420 that is curved in or recessed toward the edge portion 320. The damper 402 may be formed by pressing in a mold, however the disclosure may not be limited thereto as the damper 402 may instead be formed by other techniques.

The damper 402 may be formed on each side of the second accommodating portion 420. The second accommodating portion 420 may include a first side, a second side and a third side. The first side may extend from the first accommodating portion 410 and in the first diagonal direction (e.g., the first diagonal direction DIA1 in FIG. 6), the second side may extend from the first side and in the second diagonal direction (e.g., the second diagonal direction DIA2 in FIG. 6), and the third side may extend from the second side towards the first accommodating portion 410 and in the first diagonal direction DIAL The damper 402 may be formed in each of the first side, the second side and the third side. By forming the damper 402 in each of the first side, the second side and the third side of the second accommodating portion 420, even if the loading target part 100 moves within the tray 400, the first adhesive layer 212 and the second adhesive layer 222 may not contact or rub up against the tray 400.

Figure 11:
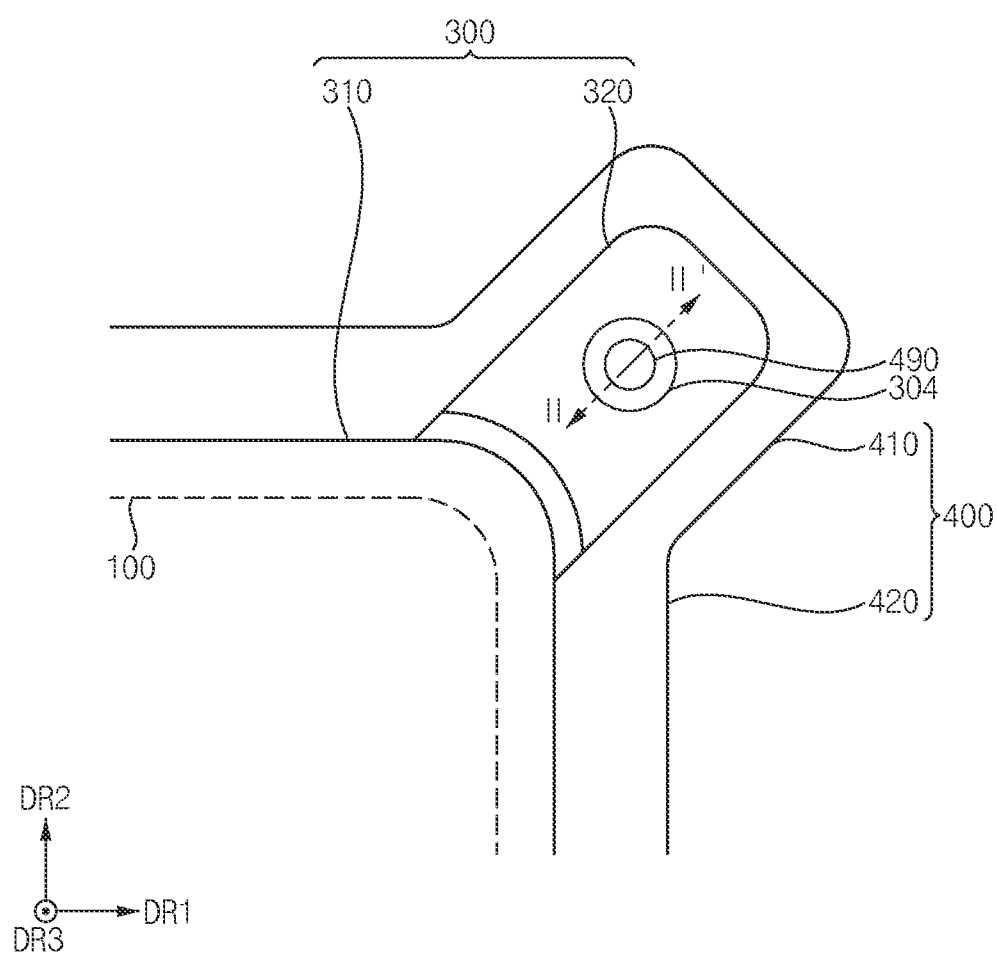
FIG. 11 is an embodiment of the second accommodating portion of FIG. 6.
Figure 12:
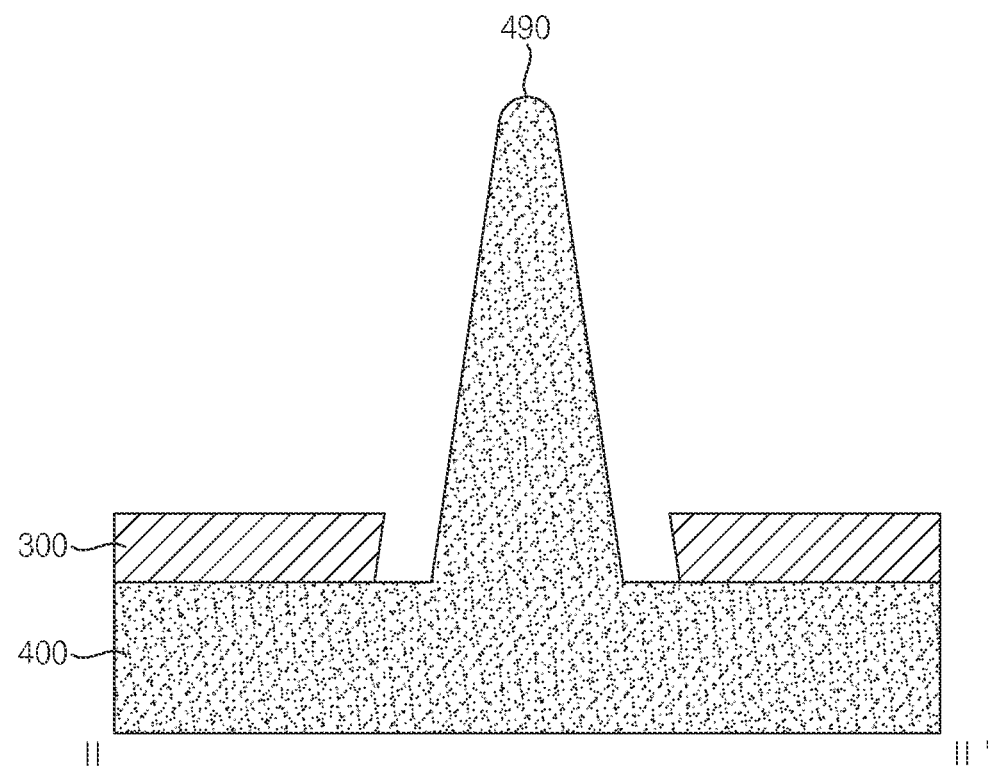
FIG. 12 is a schematic cross-sectional view according to a II-II' line of FIG. 11.

Turning now to FIGS. 11 and 12, FIG. 11 is another variation of the embodiment of FIG. 6 focusing in on the second accommodating portion 420, and FIG. 12 is a schematic cross-sectional view taken along line II-II' of FIG. 11. Referring to FIGS. 11 and 12, a hole 304 may be formed in the edge portion 320 of the cover film 300. The second accommodating portion 420 may further include the fixing portion 490 capable of being inserted into hole 304 formed in the edge portion 320.

In the schematic cross-sectional view of FIG. 12, the fixing portion 490 may have a conical shape. The conical shape may have a diameter decreasing from the cover film 300 upwards in the third direction DR3. For example, the fixing portion 490 may have the conical shape with the diameter decreasing from the bottom surface of the tray 400 in the third direction DR3. Accordingly, even if the loading target part 100 moves within the tray 400, the first adhesive layer 212 and the second adhesive layer 222 may not contact the tray 400.

In an embodiment, the fixing portion 490 of the tray 400 and a remainder of the tray 400 may be integral with each other upon the forming of the tray 400. For example, the tray 400 including the fixing portion 490 in the second accommodating portion 420 may be manufactured by pressing in the mold. By having the fixing portion 490 integral with the tray 400, the fixing portion 490 may include a same material as the first accommodating portion 410 and the second accommodating portion 420.

In another variation of the embodiment of FIGS. 11 and 12, the fixing portion 490 may be detachable from the second accommodating portion 420 of the tray 400. When the fixing portion 490 is detachable, the fixing portion 490 may be made out of a same or a different material as that of the first accommodating portion 410 and the second accommodating portion 420. In case that the hole 304 may not be formed in one or more of the edge portions 320 of the cover film 300, the fixing portion 490 may be detached from the second accommodating portion 420 of the tray 400 to allow the cover film 300 to be accommodated in the tray 400. In case that the hole 304 may be formed in the edge portion 320 of the cover film 300, the fixing portion 490 may penetrate the hole 304. Multiple fixing portions 490 may be included up to the number of holes 304 formed in the cover film 300. For example, the fixing portion 490 may be present in each of the second accommodating portions 420.

Although the above has been described with reference to embodiments of the disclosure, a person having ordinary knowledge in the relevant technical field may be modified and changed variously the disclosure without departing from the technical spirit and scope of the disclosure described in the following claims.

The disclosure may be applied to a method of manufacturing of, a display device and an electronic device including the display device. For example, the disclosure may be applied to the method of manufacturing of high-resolution smartphone, cell phone, smart pad, smart watch, table personal computer, navigation system for vehicle, television, computer monitor, notebook, the like, or a combination thereof.

In concluding the detailed description, those skilled in the art will appreciate that many variations and modifications can may be made to the preferred embodiments without substantially departing from the principles and spirit and scope of the present disclosure. Therefore, the disclosed preferred embodiments of the invention are used in a generic and descriptive sense only and not for purposes of limitation.

What is claimed is:

1. A tray module comprising:
    a first protective film including a first adhesive layer disposed on a first base film layer, the first adhesive layer including a bottom surface in contact with a loading target part;
    a second protective film including a second adhesive layer disposed on a second base film layer, the second adhesive layer including an upper surface in contact with the loading target part, a portion of the second adhesive layer being exposed by a distance in a lateral direction from an edge of the first protective film;
    a cover film disposed on the first protective film and contacting the exposed portion of the second adhesive layer; and
    a tray to accommodate the loading target part.

2. The tray module of claim 1, wherein the cover film comprises:
    a central portion corresponding to the loading target part in a plan view; and
    a first edge portion protruding in a diagonal direction from the central portion.

3. The tray module of claim 2, wherein the cover film further comprises a second edge portion.

4. The tray module of claim 3, wherein the first and the second edge portions are spaced-apart from each other in the diagonal direction in the plan view.

5. The tray module of claim 2, wherein a hole is disposed in the first edge portion.

6. The tray module of claim 2, wherein the first edge portion comprises a damper.

7. The tray module of claim 6, wherein the damper protrudes outward from a periphery of the first edge portion.

8. The tray module of claim 1, wherein the cover film extends beyond a peripheral edge of the second protective film in the lateral direction.

9. A tray module comprising:
    a first protective film covering a loading target part;
    a cover film disposed on the first protective film, the cover film including a central portion corresponding to the loading target part and an edge portion protruding in a diagonal direction from the central portion in a plan view; and
    a tray including:
        a first accommodating portion corresponding to the central portion, wherein a peripheral edge of the first accommodating portion extends beyond a corresponding peripheral edge of the central portion by a first shortest distance, and
        a second accommodating portion corresponding to the edge portion, wherein a peripheral edge of the second accommodating portion extends beyond a corresponding peripheral edge of the edge portion by a second shortest distance,
    wherein the second shortest distance is less than the first shortest distance.

10. The tray module of claim 9, wherein the second accommodating portion is adjacent to each of at least two edges of the first accommodating portion in the plan view.

11. The tray module of claim 10, wherein the tray comprises two second accommodating portions, the two second accommodating portions being spaced-apart from each other in the diagonal direction in the plan view.

12. The tray module of claim 9, further comprising:
    a second protective film disposed under the loading target part.

13. The tray module of claim 12, wherein a distance between a sidewall of the tray and the second protective film is equal to a distance between the sidewall of the tray and the cover film.

14. The tray module of claim 12, wherein a distance between a sidewall of the tray and the second protective film is larger than the distance between the sidewall of the tray and the cover film.

15. The tray module of claim 9, wherein a distance between a sidewall of the tray and the first protective film is larger than a distance between the sidewall of the tray and the cover film.

16. The tray module of claim 9, wherein a damper is disposed in the second accommodating portion.

17. The tray module of claim 16, wherein the damper is a recess curved inwards towards the edge portion.

18. The tray module of claim 9, wherein a hole is disposed in the edge portion.

19. The tray module of claim 18, wherein the second accommodating portion further comprises:
    a fixing portion penetrating the hole.

20. The tray module of claim 19, wherein the fixing portion has a conical shape with a diameter decreasing with distance from the second accommodating portion.

* * * * *